(12) United States Patent
Chiou

(10) Patent No.: US 8,288,876 B2
(45) Date of Patent: Oct. 16, 2012

(54) BONDING WIRE PROFILE FOR MINIMIZING VIBRATION FATIGUE FAILURE

(75) Inventor: Jen-Huang Albert Chiou, Libertyville, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 140 days.

(21) Appl. No.: 12/780,106

(22) Filed: May 14, 2010

(65) Prior Publication Data

US 2011/0278682 A1 Nov. 17, 2011

(51) Int. Cl.
*H01L 23/48* (2006.01)
(52) U.S. Cl. .......................... 257/786; 438/617; 257/784
(58) Field of Classification Search .................. 257/784, 257/786; 438/617
See application file for complete search history.

(56) References Cited

U.S. PATENT DOCUMENTS

| | | | |
|---|---|---|---|
| 4,518,735 A | 5/1985 | Goodrich et al. | |
| 5,091,772 A | 2/1992 | Kohara et al. | |
| 5,200,640 A | 4/1993 | Scheftic et al. | |
| 5,205,463 A | 4/1993 | Holdgrafer et al. | |
| 5,818,114 A * | 10/1998 | Pendse et al. | 257/786 |
| 2009/0072416 A1* | 3/2009 | Sano | 257/784 |
| 2010/0084773 A1* | 4/2010 | Itaya et al. | 257/784 |

FOREIGN PATENT DOCUMENTS

| | | |
|---|---|---|
| DE | 10049356 A1 | 5/2001 |
| EP | 1455165 A1 | 9/2004 |
| JP | 4196233 A | 7/1992 |
| JP | H4-196233 | 7/1992 |

OTHER PUBLICATIONS

Schafft et al.: "Testing and Fabrication of Wire-Bond Electrical Connections, A Comprehensive Survey" National Bureau of Standards, Technical Note, US, vol. 726, Sep. 29, 1972, pp. 1-129, XP009151273.
International Search Report dated Apr. 12, 2012, from corresponding International Patent Application No. PCT/US2011/036423.

* cited by examiner

*Primary Examiner* — Marcos D. Pizarro
*Assistant Examiner* — Bilkis Jahan

(57) ABSTRACT

Any two segments of a wire bonded on two bond pads at different elevations can be distinguished by a stationary node (or zero-displacement) during its second-mode vibration. In order to boost the natural frequency of such a bond wire to avoid a second-mode resonance occurring at the lowest frequency in the in-plane vibration, a wire can be optimized by connecting two equalized (shortest possible) wire segments to replace a wire consisting of a larger segment and a shorter segment. The purpose is to re-distribute a larger vibration movement in the longer segment with a lower stiffness of an arbitrary bond wire to two smaller equalized segments of an optimized wire to reduce an in-plane vibration to significantly improve the wire natural frequency and reliability in a harsh vibration environment such as over 30 kHz.

20 Claims, 6 Drawing Sheets

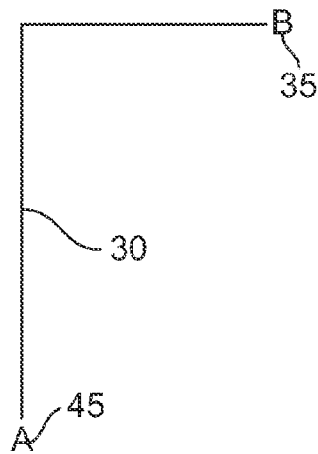
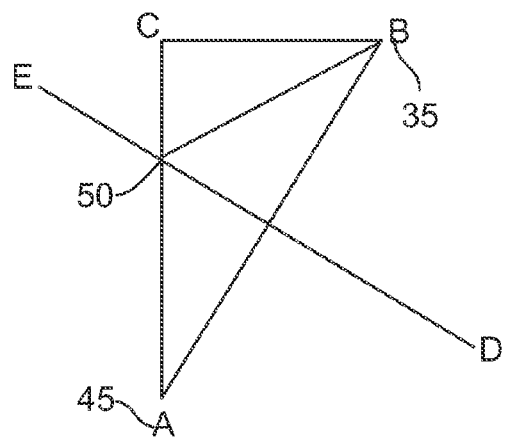
FIG. 8  FIG. 9
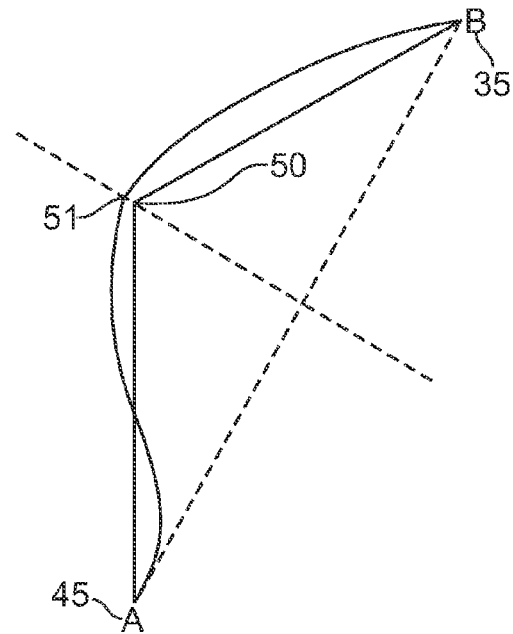
FIG. 10

BONDING WIRE PROFILE FOR MINIMIZING VIBRATION FATIGUE FAILURE

BACKGROUND

Wire bonding has been used for an electrical connection for many years. Wire bonding is generally considered the most cost-effective and flexible interconnect technology, and is used to assemble the majority of semiconductor packages. As used herein, the term bond wire refers to the wire that provides electrical connections inside the packaging for an electronic device. By way of example, bond wires are used inside the plastic packages that house microprocessors. They provide electrical connections between the numerous, externally-visible connection pins which extend from a plastic package and connection points on the integrated circuit die inside the plastic package.

Wire diameters start at 15 μm (0.6 mils) or a little thinner, which is much thinner than a human hair and can be up to several hundred micrometers for high-powered applications. While some bond wires are made of aluminum or copper, partly because it is inexpensive or more conductive, most bond wires are made of gold in a corrosion environment because gold will not corrode and will provide a more reliable connection over time than will aluminum or copper.

Microprocessors and other electronic devices that use bond wires in some applications are subjected to vibration and/or mechanical shock. In certain applications, the frequency and amplitude of the vibration is so extreme, for example 20 Gs (1 G=9.8 meter/sec$^2$) over 30 kHz, the bond wire's connection to a bond pad or other surface can encounter a high-cycle fatigue failure.

Experiments and computer simulations have shown that bond wire failure at the point of connection to a substrate or bond pad is mainly due to the bond wire's natural frequency resonant to the frequency of a forcing vibration applied to the device. Stated another way, if an electronic device is vibrated at a frequency that is substantially equal to the natural frequency of the bond wire, the bond wire's resultant vibration at its resonant frequency can be amplified in the order of magnitude and is likely to cause the wire to fatigue fail where it is attached to a bond pad. One prior art solution to preventing wire fatigue failure is to use aluminum wires to boost natural frequencies because aluminum has a lower mass density. Using aluminum however, requires the bonding wire to be embedded in a viscous gel to avoid wire corrosion. One disadvantage of using a gel is that a gel container or gel dam typically that is required to confine the gel can make the resulting device more complicated and more expensive. In a certain application, a specific vibration axis in a bond wire having a higher natural frequency exceeding the forcing frequency would be an improvement over the prior art in that it would avoid vibration fatigue failure. Avoiding the use of a viscous gel to reduce fatigue failure would also be an improvement over the prior art. Another advantage is also found in that a wire with an optimized profile is the shortest, or nearly the shortest, which can also save cost during high-volume manufacturing.

BRIEF DESCRIPTION OF THE DRAWINGS

FIG. 8, 9 depict representations and calculation of an embodiment of an idealized shape for a bond wire used to electrically connect two bond pads with a vertical separation distance greater than their horizontal separation distance.

FIG. 10 shows an optimized wire profile used to electrically connect two bond pads with a vertical separation distance greater than their horizontal separation distance.

DETAILED DESCRIPTION

Figure 1A:
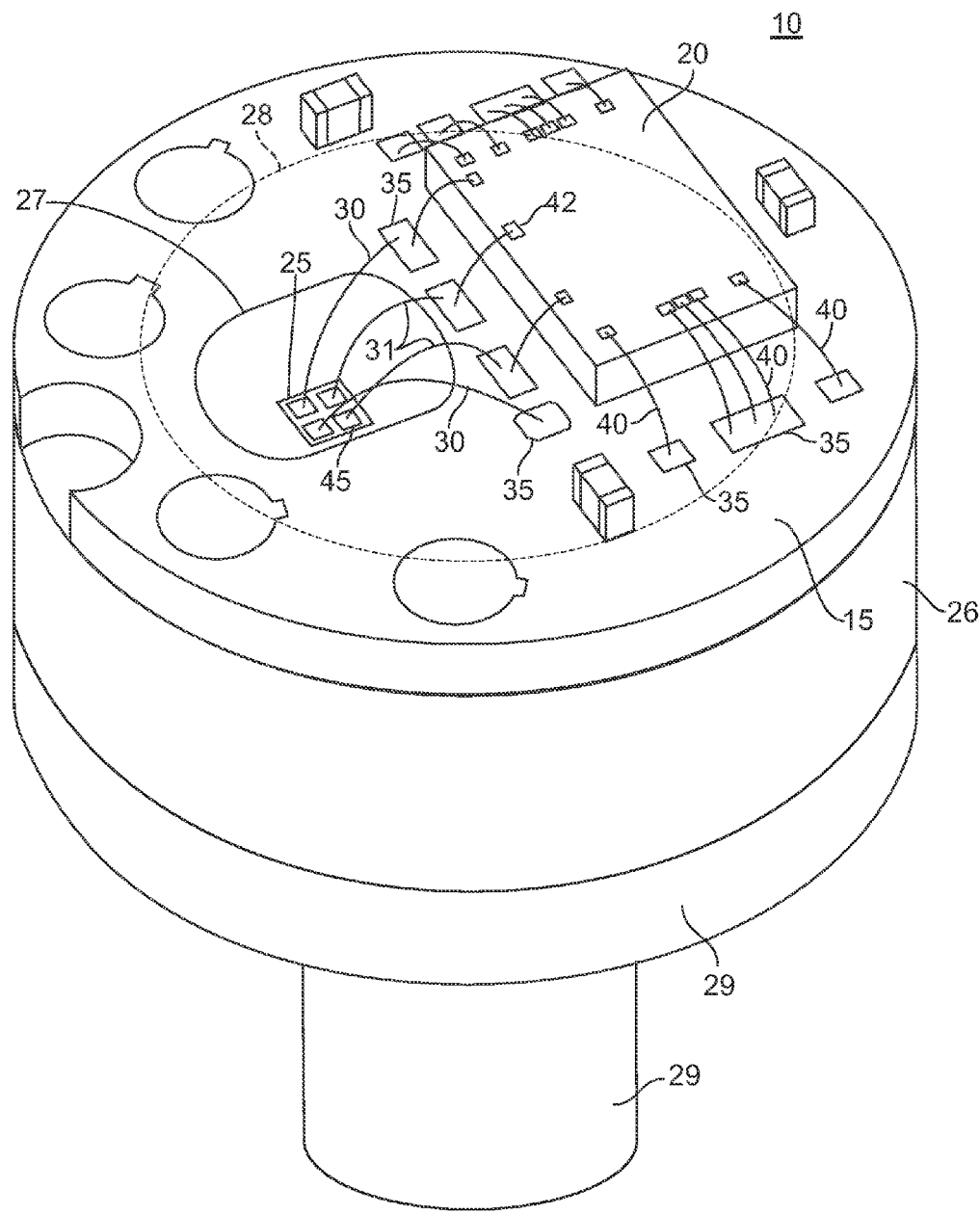
FIG. 1A is a perspective view of a pressure sensor comprised of an integrated circuit electrically connected to a piezoresistive transducer (PRT) die at a lower elevation by way of thin, elongated bond wires.
Figure 1B:
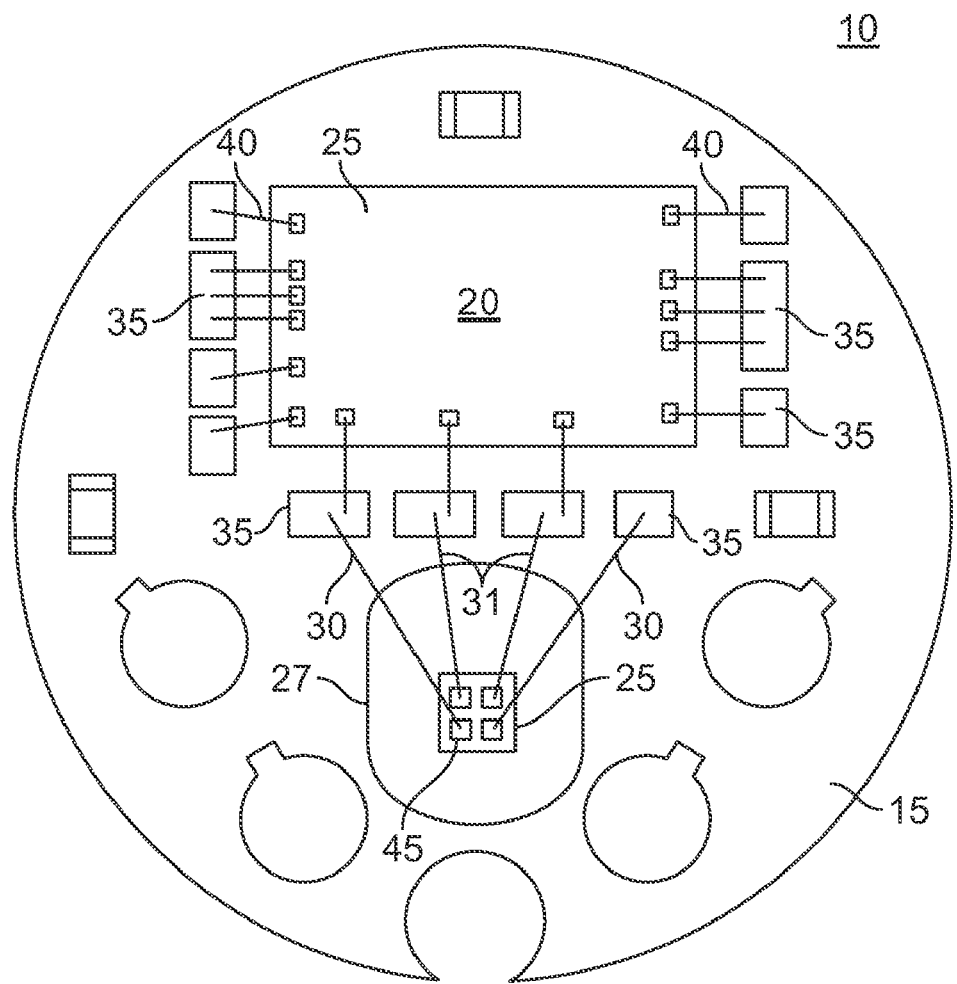
FIG. 1B is a top view of the pressure sensor depicted in FIG. 1A.

FIG. 1A is a perspective view of a pressure sensor 10, which also uses bond wires to make internal connections between components therein. FIG. 1B is a top view of the pressure sensor 10 shown in FIG. 1A.

The pressure sensor 10 is comprised of a small printed circuit board (PCB) 15, which sits atop a spacer 26. The PCB 15 supports an application-specific integrated circuit (ASIC) 20. The ASIC 20 inputs and outputs electrical signals to other circuitry and devices not all shown in the figure. The electrical signals from the ASIC 20 represent fluid pressures that are sensed by a piezoresistive pressure transducer (PRT) die 25. As shown in the figure, the PRT die 25 is placed on the top 28 of a metal port 29 that extends through the spacer 26 and which is used to resist high fluid pressure. An open end of the port 29 is below the PCB 15. The PRT die 25 is placed on top 28 of the port 29. The connection pads or bond pads 35 on the PCB 15 are therefore at an elevation that is above or higher than the bond pads 45 on the PRT die 25, which is located below the bottom of the PCB hole 27.

Electrical connections between the PRT die 25 and electrical connection pads 35 on the PCB 15 are provided by four elongated bond wires 30 and 31 made of gold. Other electrical connections between the ASIC 20 and connection pads 35 on the PCB 15 are made by relatively short bond wires 40. With regard to the long bond wires, two of them on the outside are identified by reference numeral 30 and are longer than the two inner bond wires 31. The bond wires 30, 31 and 40 electrically connect the ASIC 20 to the PCB 15 and the PRT die 25.

Bond wires, including the bond wires 30, 31 and 40 shown in the figures are quite thin having average diameters between about one mil (0.001 inch) and about 2 mils (0.002 inch). The long bond wires 30 shown in FIG. 1A and FIG. 1B have pre-determined lengths and shapes in order to effectuate an electrical connection between the pads that the wires 30 connect together. In the preferred embodiment, the long wires 30 are sized, shaped and arranged such that the long bond wires 30 have a second natural frequency above the highest vibration frequency that the pressure sensor 10 is likely to be subjected to during operation. By raising the bond wire's natural frequency over the forcing frequency, vibration-induced fatigue failures can be reduced significantly.

The natural frequency of the bond wire 30 is influenced in part by the wire's length as well as the path or profile of the wire 30 between the gold connection pads 35 on the PCB 15 and bond pads 45 on the PRT die 25. The profile of the bond wire 30 is considered to be the shape or path of the bond wire 30 between the bond wire's point of connections to bond pads. As is known in the art, the shape or path of a bond wire is determined and controlled by wire bonding equipment that is used to apply the bond wires when a semiconductor or other device using bond wires is manufactured.

As noted above and as can be seen in the figures, the connection pads 35 on the PCB 15, which are also known as bond pads, are at an elevation located above or higher than the bond pads 45 on the PRT die 25. Experimental measurements using a laser vibrometer and computer models using finite element analysis (FEA) show that when the wire 30 is subjected to vibration, connections at each end of the bond wire 30 are much less likely to fail, if the bond wire 30 has a length and profile selected to effectively shorten and therefore raise the frequency of the horizontal portion of the bond wire. The frequency of the horizontal portion of the bond wire can be increased by having a portion of the bond wire 30 act similar to a vertical support. One portion or segment of the bond wire 30, which is a relatively-vertical segment, acts as a support for an adjacent second segment that is relatively horizontal. The relatively vertical portion of the two segments thus enables the use of a shortened horizontal section. Shortening the horizontal section effectively raises its natural frequency.

For purposes of brevity, connection pads 35 located on the PCB 15 are hereinafter referred to as bond pads. It can be seen in both FIG. 1A and FIG. 1B that for the sensor 10, a first bond pad 45 on the die 25 and a second bond pad 35 on the PCB, are vertically and horizontally spaced apart from each other. The second bond pad 35 is an elevation or position that is higher than the first bond pad 45. On the plane of the bond wire, the two bond pads 35 and 45 are also horizontally spaced apart from each other by a distance greater than the vertical separation distance.

Figure 2:
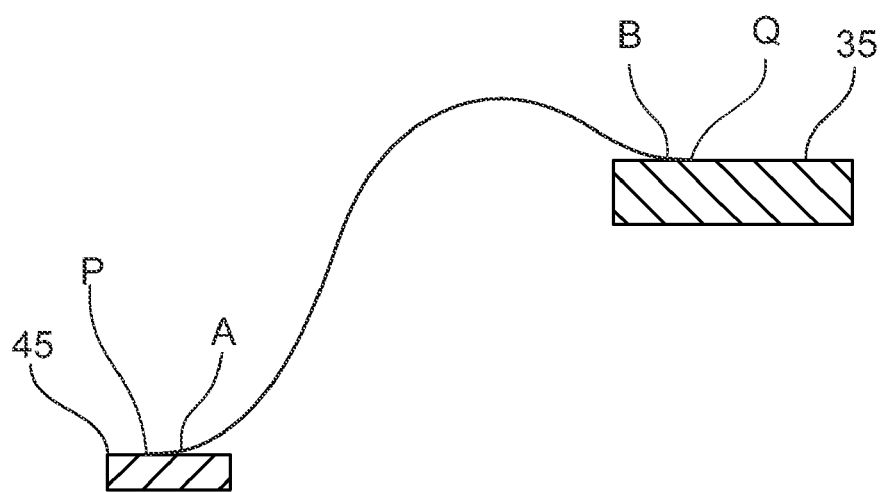
FIG. 2 is a side view of the bond wire depicted in FIG. 1A and FIG. 1B.

FIG. 2 shows a side view of a wire. Point A and Point B are points of the wire that start to leave or extend upwardly and away from corresponding bond pads 45 and 35. Points A and B also serve as the points for fixed boundary conditions. Point P and Point Q are the real ending points of a bond wire. In modal analysis using the finite element method, line segments PA and BQ are neglected since they are bonded on to the bond pads and do not move.

Figure 3A:
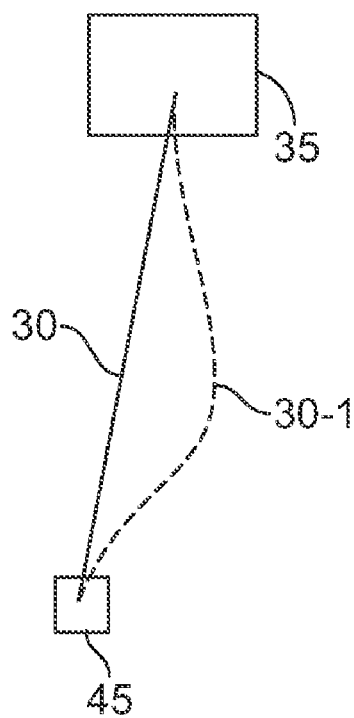
FIGS. 3A and 3B are top views of the bond wire vibrating in a first mode and a fifth mode respectively.
Figure 3B:
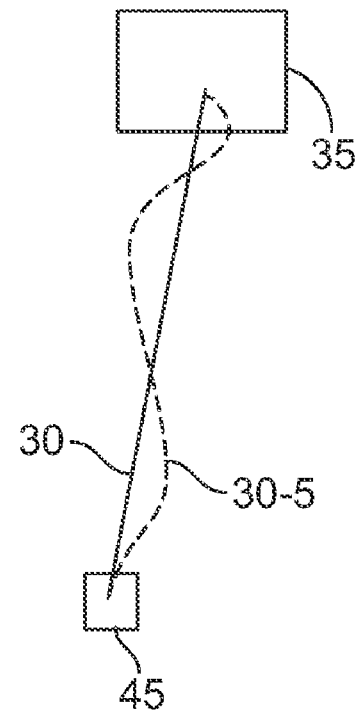

A bond wire has specific vibration mode characteristics. The wire 30 vibrates out of plane and side sway back and forth (or "flip flops" side-to-side) when viewed from the top view of a bond wire in the odd-numbered mode shapes such as the first mode, the third mode, etc. while the wire vibrates in plane and up-and-down and left-and-right if viewed from a side view. FIG. 3A depicts how the bond wires move in a first mode of vibration and FIG. 3B shows how the bond wires move in a fifth mode of vibration when they are subjected to vibration. As shown in FIG. 3A, in Mode 1, the bond wires 30 move side sway back and forth with half a wave 30-1 when viewed from the top of wires. As shown in FIG. 3B, in Mode 5, the bond wires 30 move side sway back and forth with 1.5 waves 30-5.

Figures 4A, 4B, 4C:
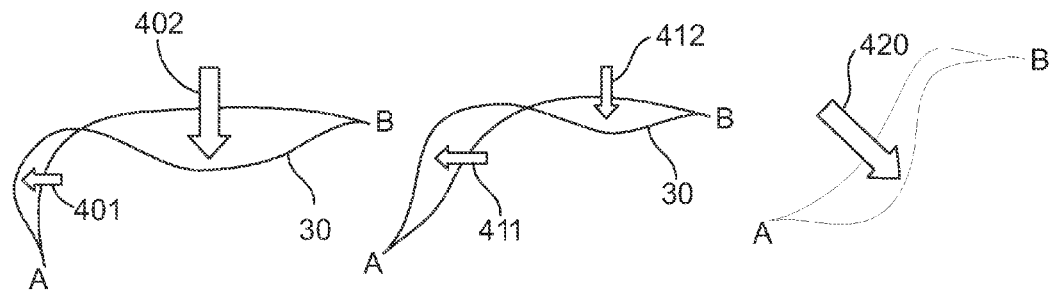
FIGS. 4A, 4B, and 4C depict different mode shapes with frequencies for bond wires with different profiles and lengths vibrating in the second mode of vibration.

FIGS. 4A, 4B, and 4C are side views of the gold bond wires 30 with different profiles when they are subjected to vibration and when the wire vibrates in Mode 2. Table 1 lists the diameter of the bond wire 30, its length and the Mode 2 natural frequency determined using finite element analysis for each wire shown in FIGS. 4A, 4B and 4C.

TABLE 1

| Figure | 4A | 4B | 4C |
|---|---|---|---|
| Wire diameter | 2 mils | 2 mils | 2 mils |
| Wire length | 2.69 mm. | 2.39 mm. | 2.41 mm |
| Mode 2 freq. | 25.7 kHz. | 42.1 kHz. | 19.8 kHz. |

FIG. 4A shows a relatively large vertical displacement of the wire's horizontal segment and a much smaller horizontal displacement of the wire's vertical segment. Table 1 shows a relatively low Mode 2 natural frequency. FIG. 4B shows displacements in the horizontal and vertical segments that are more similar to each other and which are smaller than the relatively larger vertical displacement of the horizontal segment of the wire shown in FIG. 4A. Table 1 also shows a much higher Mode 2 natural frequency. A comparison of the lengths of the horizontal sections shown in FIGS. 4A and 4B and the data in Table 1 shows that the length of the horizontal segment of FIG. 4B is shorter than the length of the horizontal segment of FIG. 4A. The natural frequency of the segment shown in FIG. 4B will therefore be higher than the natural frequency of the segment shown in FIG. 4A.

In order to boost the natural frequency of a bond wire, a wire profile can be optimized by using two wire segments having equal or substantially equal lengths (see FIG. 4B) because a large vibration movement in the longer segment of the bond wire in FIG. 4A can be re-distributed and reduced by two shorter and therefore stiffer segments of the bond wire in FIG. 4B. FIG. 4C shows if the horizontal segment is made even shorter, the vibration mode of the wire shifts to an inclined movement and the frequency drops significantly. FIGS. 4A, 4B, and 4C thus demonstrate that the wire profile actually plays a very important role in the stiffness distribution on the wire, it influences the vibration frequency and the vibration mode shapes. These figures also show that a shorter bond wire not always will have a higher natural frequency in a second-mode vibration because the bond wire is not a straight wire.

In the figures, reference numeral 50 identifies an idealized segment meeting point, which is a theoretical stationary node or point of zero displacement of the wire 30 in its second mode of vibration. The idealized segment meeting point 50 is at the same elevation of the second bond pad relative to the first bond pad 45.

Figures 5A, 5B:
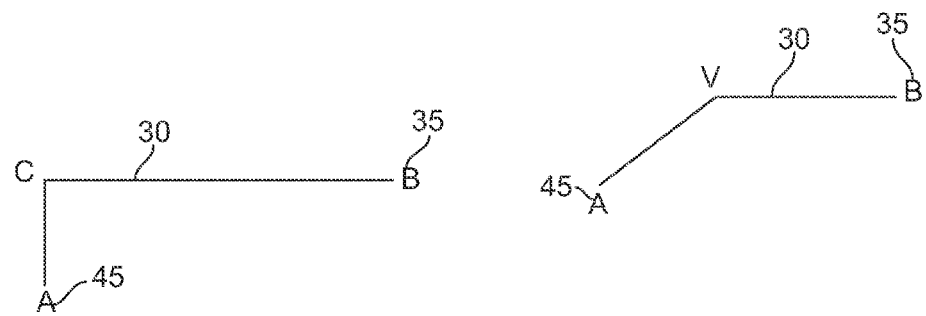
FIGS. 5A, 5B and 5C depict the ideal optimal wire profile and how to locate an ideal connecting point for the wire consisting of two wire segments.
Figure 5C:
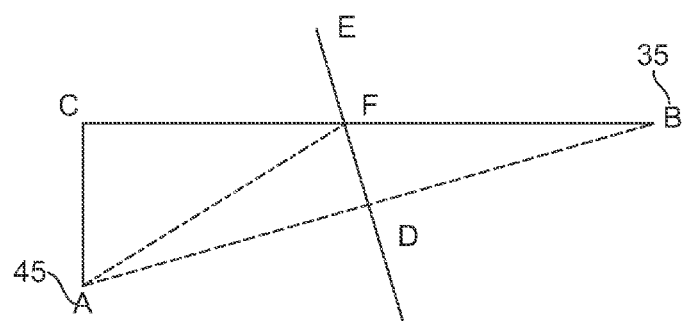

A relatively precise location of the idealized segment meeting point 50 can be determined using a geometric construction method depicted in FIGS. 5A, 5B and 5C. FIG. 5A depicts the vertical and horizontal separation of the two bond pads 35 and 45 from each other and their connection to each other using two orthogonal line segments. In FIG. 5A, one of the orthogonal segment extends vertically from the first bond pad 45 to an elevation where it meets the second segment that extends horizontally from the second bond pad 35.

In FIG. 5B, the first bond point is identified by the letter A; the second bond point is identified by the letter B. The vertex of the aforementioned vertical and horizontal lines is identified by the letter V.

To find the idealized segment meeting point 50, a line segment ED is drawn between the two bond points A and B. Line segment ED is constructed as a perpendicular bisector of line segment AB. Perpendicular bisector segment ED intersects the horizontal line segment BC at point F. Line segment BC and point F are at the same elevation of the second bond pad 45 on the PCB 15. Point F is the location of the idealized segment meeting point 50. The side-angle-side (SAS) theorem of Euclidean plane geometry establishes that line segments AF and FB, are equal in length. The idealized segment meeting point F is thus located at the vertex or point F between two segments AF and FB of an idealized bond wire AFB.

For purposes of the SAS theorem, it is given that line segment AD=DB because ED bisects AB. It is also given that the angle ADF=angle BDF=90 degrees because ED is given as perpendicular to AB. Since line segment FD is a side for both triangles, the SAS theorem holds that triangle AFD and triangle BFD are congruent. Since the triangles are congruent, line AF=FB.

While the two bond pads 35 and 45 are at different elevations and horizontally spaced from each other, connecting them together using a wire as shaped in FIG. 5C, which corresponds to the two line segments AF and FB, will create a stress point at the idealized segment meeting point 50. Connecting them using a wire shaped as shown in FIG. 5B would also be difficult to implement for a real wire bonding process. A preferred shape for the bond wire 30 therefore connects the two bond pads 35 and 45 through an actual segment meeting point that may not be exactly on the idealized segment meeting point but which is substantially coincident with the idealized segment meeting point in order to avoid having to create a stress point while simultaneously providing a point of near-zero displacement of the wire during a second mode vibration.

Figure 6:
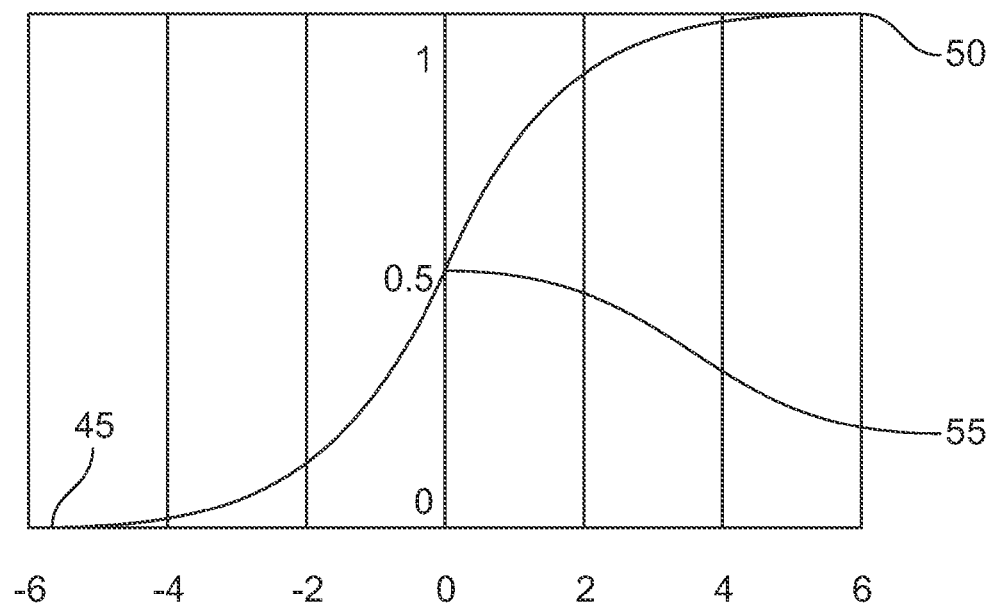
FIG. 6 depicts a sigmoid curve, which closely approximates the idealized shape of a first segment of a bond wire.

FIG. 6 depicts a sigmoid curve, which is well known and defined by the equation:

$$Y(x) = \frac{1}{(1+e^{-x})}$$

A segment of a modified sigmoid curve can be developed and used for a wire segment according to the formula:

$$Y(x) = \frac{a}{1+e^{-x}} - \frac{a}{1+e^b}$$

Where a, b, and c are positive real numbers: a is an amplification factor and the range, x is specified from −b to c. For a preferred embodiment, the values of a, b and c are selected such that the profile or path of the sigmoid curve portion follows the inclined line segment between points A and 51 as closely as the wire bonding machinery, which places the bond wire 30, will allow.

A modified sigmoid curve, having a shape represented by the formula above, closely approximates the shape of the first segment of the bond wire 30. In the preferred embodiment, the sigmoid-curve segment of the bond wire 30 is located between the lower or first bond pad 45 and the aforementioned actual segment meeting point. It can be seen in FIG. 7 that the modified sigmoid curve has a first portion of segment wherein the slope of the curve increases continuously from the bond pad 45 to an inflection point 55, which is near the midpoint of the modified sigmoid curve. The modified sigmoid curve also has a second segment, which extends from the inflection point 55 to the actual segment meeting point identified in FIG. 7 by reference numeral 51 wherein the slope of the curve decreases continuously.

Figure 7:
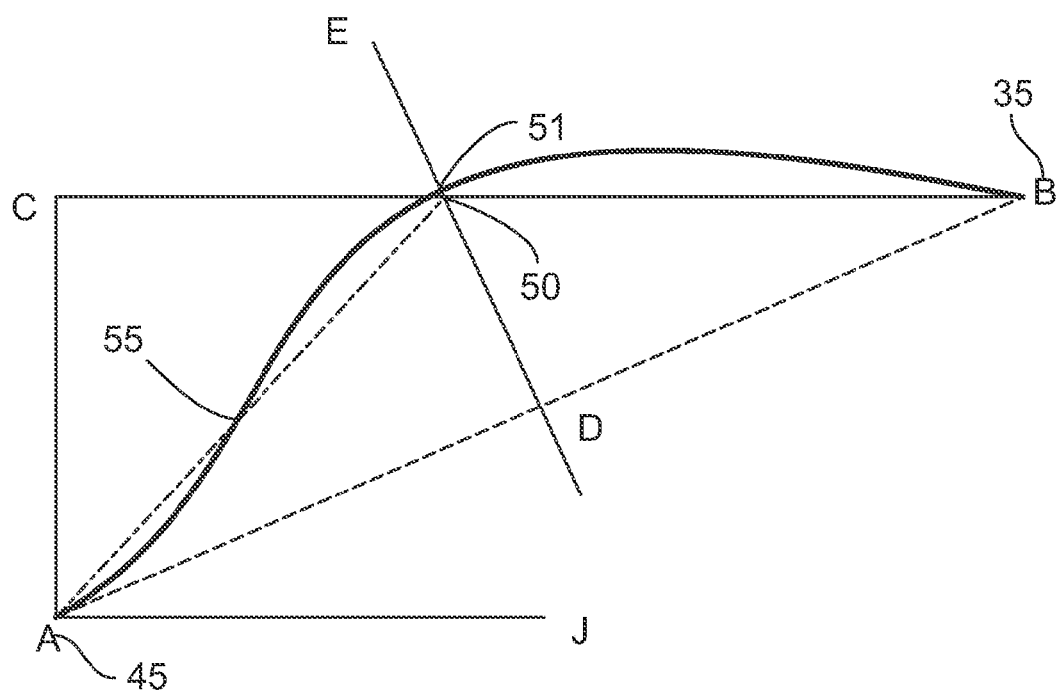
FIG. 7 shows an optimized wire profile and depicts the determination of an idealized meeting point for two wire segments of a bond wire.

In FIG. 7, reference numeral 50 identifies an idealized segment meeting point, which is a stationary node, i.e., a point of zero or near-zero displacement, of the wire 30 in its second mode of vibration. The actual segment meeting point 51 is nearby but not always coincident with the idealized segment meeting point 50 due to the fact that the wire 30 cannot always be formed to pass through the idealized segment meeting point 50.

The idealized segment meeting point 50 is at the same elevation of the second bond pad 35 relative to the first bond pad 45 whereas the actual segment meeting point is slightly higher or lower than the second bond pad 35. The idealized segment meeting point 50 is also midway between the first bond pad 35 and second bond pad 45. Stated another way, the idealized segment meeting point 50 is equidistant or substantially equidistant from both end points of the bond wire 30.

FIG. 7 depicts a side view of a preferred shape for the bond wire 30 and the actual meeting point 51 of two segments of the wire 30 that are on either side of the actual meeting point 51. The right-hand segment of the bond wire 30, which is between the actual segment meeting point 51 and the second bond pad 35, is slightly convex. In a preferred embodiment, the second segment is a nearly-linear parabolic curve with a slope at the second bond pad end that is preferably less than ten degrees or less but in alternate embodiments can be as much as 45 degrees or less.

FIGS. 8-10 depict the determination of a bond wire 30 shape, which will raise the natural frequency and connect two bond pads having a vertical separation distance greater than their horizontal separation distance. As can be seen in FIG. 9, a line segment AB drawn between the two bond pads is bisected with a perpendicular bisector ED. The intersection of the perpendicular bisector ED with the longer leg, line segment AC of the right triangle ACB defines the idealized segment meeting point 50.

In FIG. 10, a first inclined S line segment having a shape of a modified sigmoid curve extends from the first bond pad 45 to an actual segment meeting point 51, which is at or near the stationary node or a point of zero displacement during second mode vibration of the bond wire 30. In a preferred embodiment, the second segment is a parabolic curve with a slope at the second bond pad end that is preferably less than ten degrees or less but in alternate embodiments can be as much as 45 degrees or less.

It is important to note that the first segments have a shape substantially as shown in the figures. The bond wire 30 should not extend away from the first bond pad 45 away from the second bond pad 35. The shape and length of the bond wire 30 should instead be directed toward the second bond pad 35 along its length from the first bond pad in order to keep the wire as short as possible.

In addition to the advantages noted above, another advantage of the optimized bonding wire is that it reduces bonding wire fatigue failure without having to embed the bonding wire in a viscous gel. A prior art viscous gel can slow down or even prevent the oxidation of bond pads made of aluminum or other reactive metals, however, a preferred embodiment of a semiconductor device as well as a pressure sensor is to use optimized bonding wires that are not embedded in viscous gel other than the gel that might be used to coat the ends of bonding wires physically attached to a bond pad. Such a bond wire, i.e., the ends attached to a bond pad and the attached portion coated with a gel, is not considered to be embedded in a viscous gel.

The foregoing description is for purposes of illustration only. The true scope of the invention is set forth in the appurtenant claims.

What is claimed is:

1. An apparatus comprising:
   a first bond pad;
   a second bond pad at an elevation above and horizontally spaced from the first bond pad;
   an idealized segment meeting point at said elevation above the first bond pad and substantially equidistant from the first and second bond pads;
   a bond wire, connecting the first and second bond pads and passing through an actual segment meeting point, the actual segment meeting point being substantially coincident with the idealized segment meeting point, the wire comprised of:
      a first curved segment between the first bond pad and the actual segment meeting point, the first segment having an inflection point and shape such that the slope of the first segment increases continuously from the first bond pad to the inflection point and has a continuously decreasing slope from the inflection point to the actual segment meeting point; and
      a second substantially linear segment between the actual segment meeting point and the second bond pad.

2. The apparatus of claim 1, wherein the bond wire passes through a third point having zero displacement during second mode vibration of said bond wire.

3. The apparatus of claim 1, wherein the first segment does not extend from the first bond pad in a direction that is away from the second bond pad.

4. The apparatus of claim 1, wherein the first curved segment is generally sigmoid-curve shaped.

5. The apparatus of claim 1, wherein the second segment is generally parabolic-curve shaped.

6. The apparatus of claim 1, wherein the slope of the second segment is greater than zero and less than about 45 degrees toward the second bond pad.

7. The apparatus of claim 1, wherein the slope of the second segment is greater than zero and less than about ten degrees toward the second bond pad.

8. The apparatus of claim 1, wherein the bond wire is not embedded in a viscous gel.

9. A pressure sensor comprising:
   a piezoresistive (PRT) die;
   a first bond pad on the PRT die;
   a circuit board having an integrated circuit;
   a second bond pad on the circuit board; the second bond pad being at an elevation above and horizontally spaced from the first bond pad;
   an idealized segment meeting point at said elevation above the first bond pad and substantially equidistant from the first and second bond pads;
   a bond wire, connecting the first and second bond pads and passing through an actual segment meeting point, the actual segment meeting point being substantially coincident with the idealized segment meeting point, the wire comprised of:
      a first curved segment between the first bond pad and the actual segment meeting point, the first segment having an inflection point and shape such that the slope of the first segment increases continuously from the first bond pad to the inflection point and has a continuously decreasing slope from the inflection point to the actual segment meeting point; and
      a second substantially linear segment between the actual segment meeting point and the second bond pad.

10. The pressure sensor of claim 9, wherein the bond wire passes through a third point having zero displacement during second mode vibration of said bond wire.

11. The pressure sensor of claim 9, wherein the first segment does not extend from the first bond pad in a direction that is away from the second bond pad.

12. The pressure sensor of claim 9, wherein the first curved segment is generally sigmoid-curve shaped.

13. The pressure sensor of claim 9, wherein the second segment is generally parabolic-curve shaped.

14. The pressure sensor of claim 9, wherein the slope of the second segment is greater than zero and less than about 45 degrees toward the second bond pad.

15. The pressure sensor of claim 9, wherein the slope of the second segment is greater than zero and less than about ten degrees toward the second bond pad.

16. The pressure sensor of claim 9, wherein the bond wire is not embedded in a viscous gel.

17. A pressure sensor comprising:
   a piezoresistive (PRT) die;
   an integrated circuit;
   a bond wire connecting a bond pad on the PRT die and a bond pad on the integrated circuit;
   the second bond pad being at an elevation above and horizontally spaced from the first bond pad;
   an idealized segment meeting point at said elevation above the first bond pad and substantially equidistant from the first and second bond pads;
   the bond wire connecting the first and second bond pads and passing through an actual segment meeting point, the actual segment meeting point being substantially coincident with the idealized segment meeting point, the wire comprised of:
      a first curved segment between the first bond pad and the actual segment meeting point, the first segment having an inflection point and shape such that the slope of the first segment increases continuously from the first bond pad to the inflection point and has a continuously decreasing slope from the inflection point to the actual segment meeting point; and
      a second substantially linear segment between the actual segment meeting point and the second bond pad.

18. The pressure sensor of claim 17, wherein the bond wire passes through a third point having zero displacement during second mode vibration of said bond wire.

19. The pressure sensor of claim 17, wherein the first curved segment is generally sigmoid-curve shaped.

20. The pressure sensor of claim 17, wherein the second segment is generally parabolic-curve shaped.

* * * * *